United States Patent [19]
Kunitomo et al.

[11] Patent Number: 5,373,251
[45] Date of Patent: Dec. 13, 1994

[54] TRANSMISSION OUTPUT AMPLIFIER

[75] Inventors: Kouichi Kunitomo, Yokohama; Jun Sato, Fujisawa; Shinichi Fujita, Yokohama, all of Japan

[73] Assignee: Matsushita Electric Industrial Co., Ltd., Osaka, Japan

[21] Appl. No.: 151,263

[22] Filed: Nov. 12, 1993

[30] Foreign Application Priority Data

Mar. 8, 1993 [JP] Japan .................................. 5-046318

[51] Int. Cl.⁵ .................... H03G 3/00; H03G 9/00; H03G 1/00
[52] U.S. Cl. .................... 330/279; 330/285; 330/129; 330/284; 330/302
[58] Field of Search ............... 330/277, 286, 302, 303, 330/306, 284, 279; 307/285, 129, 133; 455/134

[56] References Cited

U.S. PATENT DOCUMENTS

| | | | |
|---|---|---|---|
| 4,870,370 | 9/1989 | Hedberg et al. | 330/133 |
| 4,994,757 | 2/1991 | Bickley et al. | 330/285 |
| 5,121,081 | 6/1992 | Hori | 330/279 |
| 5,150,075 | 9/1992 | Hietala et al. | 330/279 |
| 5,179,353 | 1/1993 | Miyake | 330/129 |
| 5,182,527 | 1/1993 | Nakanishi et al. | 330/285 |
| 5,214,393 | 5/1993 | Aihara | 330/129 |

FOREIGN PATENT DOCUMENTS

| | | |
|---|---|---|
| 0405445A2 | 1/1991 | European Pat. Off. . |
| 0546693A1 | 6/1993 | European Pat. Off. . |
| 63-77205A | 4/1988 | Japan . |
| 4-77102A | 3/1992 | Japan . |
| 4-328907A | 11/1992 | Japan . |
| 1590826 | 6/1981 | United Kingdom . |
| 9208282 | 5/1992 | WIPO . |
| 9302505 | 2/1993 | WIPO . |

*Primary Examiner*—William L. Sikes
*Assistant Examiner*—Fetsum Abraham
*Attorney, Agent, or Firm*—Stevens, Davis, Miller & Mosher

[57] ABSTRACT

It is an object of the invention to control a bias current of each of the amplifying elements of an exciting section and a power amplifying section in accordance with a magnitude of an amplitude control signal. A value of a control signal which is supplied to a control signal input terminal is adjusted in accordance with a magnitude of a signal to be generated which is given by an amplitude control signal. Bias currents of transistors are adjusted by the control signal. Thus, an output voltage of the exciting section is variably controlled by a control signal. Further, gate voltages of transistors are adjusted by a voltage which is applied to a gate voltage terminal. Electric power, which can be output from the power amplifying section, is variably controlled.

9 Claims, 3 Drawing Sheets

TRANSMISSION OUTPUT AMPLIFIER

BACKGROUND OF THE INVENTION

1. Field of the Invention

The invention relates to a transmission output amplifier and, more particularly, to a transmission output amplifier which is suitable for an amplifier of a small radio telephone.

2. Description of the Related Art

Hitherto, in a transmission output section of a mobile telephone of a CMTS (Cellular Mobile Telephone System) or a portable radio telephone, when dividing an output from the maximum output of 3 W to the minimum output of 5 mW into seven stages and controlling in a state in which an excitation input signal is set to be constant, there is used an APC (Auto Power Control) of a transmission output such that a power source voltage of a power amplifying section is changed to thereby adjust an output level.

Hitherto, as such a kind of transmission output amplifier, there is known an amplifier shown in FIG. 3. In FIG. 3, the transmission output amplifier comprises an exciting section A and a power amplifying section B. The exciting section A receives a signal from the front stage by an excitation input terminal 51. The signal is amplified by transistors 52 and 55. The amplified signal is supplied to the power amplifying section B through a BPF 56 and a coupling terminal 60. The signal is power amplified by transistor 62 and 65 of the power amplifying section B and is output from an output terminal 68. When an output signal of the exciting section A is applied to the power amplifying section B, an excitation output of tens of mW which is necessary for the power amplifying section B to generate the maximum output, for example, 3 W is applied. Further, a signal which is added to an output control input terminal 71 is supplied to the transistor 62 through a power control circuit 72 and a collector voltage of the transistor 62 is controlled. The transistor 65 at the final stage is excited by an output voltage of the transistor 62 and an electric power is output from the output terminal 68.

However, according to the conventional transmission output amplifier shown in FIG. 3, since a voltage or current of the transistor is controlled in the power amplifying section B, when the power amplifying section B is excited, it is necessary to excite the power amplifying section B by an electric power such that the maximum output (3 W) of the power amplifying section B can be stably output. However, since such an electric power is larger than the minimum output of the power amplifying section B, the power amplifying section B is operated as an attenuator. According to the conventional control method, although it is rational in case of transmitting the maximum electric power from the power amplifying section B, there is a problem such that a battery cannot be effectively used when a small electric power is transmitted, since electric power consumption doesn't decrease.

On the other hand, a transmission power control circuit having a construction such that a variable amplifier is arranged in front of a power amplifier is disclosed in JP-A-63-77205. According to such a circuit, however, an electric power consumption of a power amplifier cannot be reduced when a small electric power is generated.

SUMMARY OF THE INVENTION

It is an object of the invention to solve the above conventional problems and to provide a transmission output amplifier which can effectively use a power source by controlling amplification factors of amplifying elements of an exciting section and a power amplifying section on the basis of an amplitude setting signal which is given from the outside. To accomplish the above object, a transmission power amplifier of the invention comprises: an exciting section which has a plurality of amplifying elements connected in series and which voltage amplifies an input signal; a power amplifying section which has a plurality of amplifying elements connected in series and which power amplifies an output signal of the exciting section; a directional coupler coupled to an output of the power amplifying section; a detecting circuit to detect a signal obtained from the directional coupler; a subtracting circuit to obtain an exciting section control signal by subtracting an output of the detecting circuit from the amplitude setting signal which is given from the outside; exciting section output control means for adjusting a bias current of at least one of the amplifying elements of the exciting section in accordance with a magnitude of the exciting section control signal, thereby controlling the output voltage of the exciting section; a control signal forming circuit to obtain a power amplifying section control signal on the basis of the amplitude setting signal; and power amplifying section output control means for adjusting a bias current of at least one of the amplifying elements of the power amplifying section in accordance with a magnitude of the power amplifying section control signal, thereby controlling an output power of the power amplifying section.

According to the transmission power amplifier of the present invention with the construction as mentioned above, when a radio input signal is supplied to the exciting section, the bias current according to the magnitude of the exciting section control signal is supplied to the amplifying element of the exciting section, and an exciter output according to the bias current is supplied to the power amplifying section. The bias current according to the magnitude of the power amplifying section control signal is supplied to the amplifying element of the power amplifying section. The electric power according to the bias current can be output. Due to this, since an electric power which can be output from the power amplifying section and the actual output of each section are determined on the basis of the amplitude setting signal, when the amplitude setting signal is small, a bias current of each section can be reduced and when the amplitude setting signal is large, an excitation power can be increased. The output to electric power consumption characteristics can be always highly maintained.

DESCRIPTION OF THE PREFERRED EMBODIMENTS

An embodiment of the invention will now be described hereinbelow with reference to the drawings.

Figure 1:
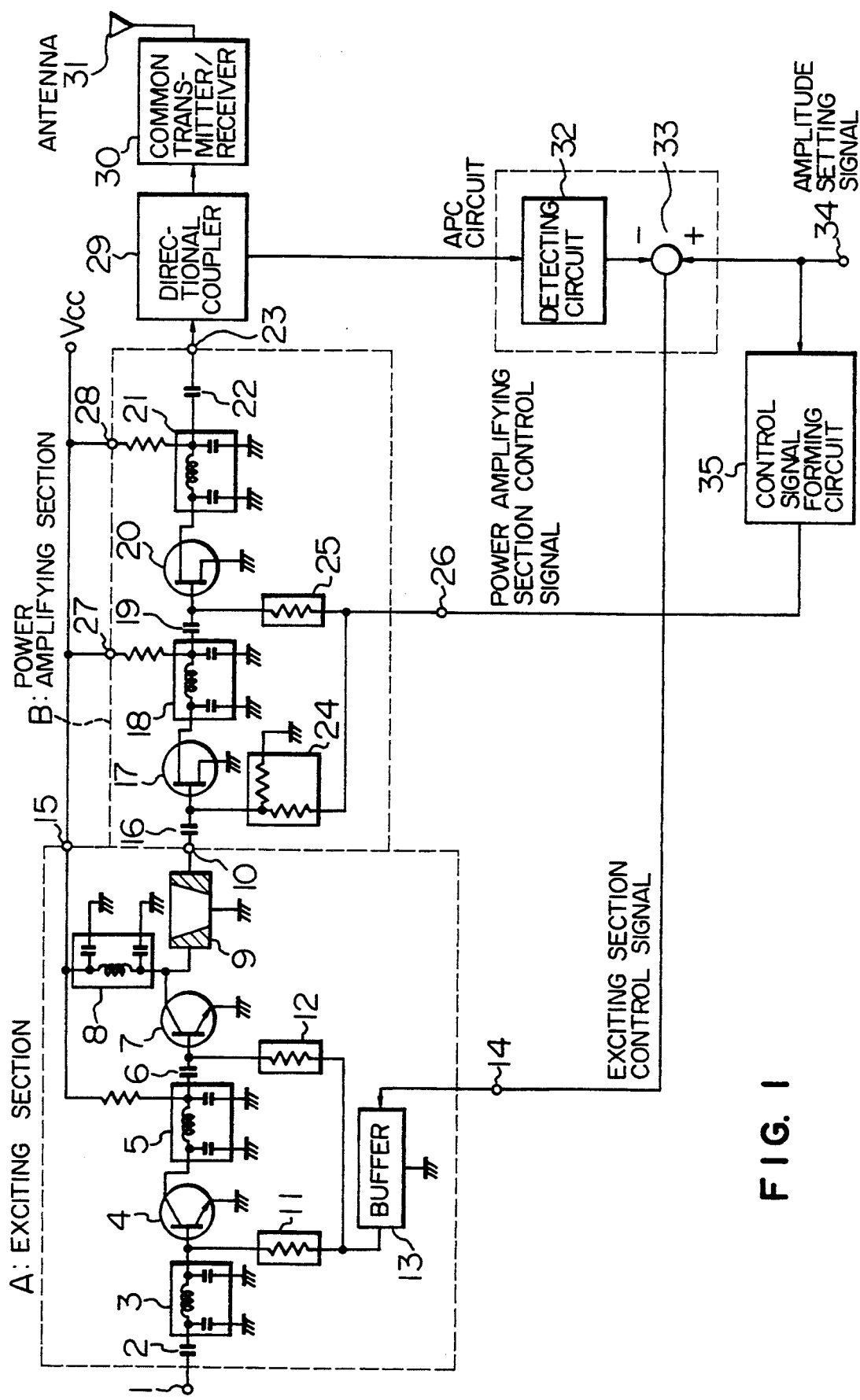
FIG. 1 is a block diagram showing a construction of an embodiment of a transmission power amplifier according to the invention.

FIG. 1 is a block constructional diagram of a transmission output amplifier showing an embodiment of the invention. In FIG. 1, the transmission output amplifier of the embodiment comprises an exciting section A and a power amplifying (RF power amplifying) section B. The exciting section A comprises: an RF input terminal 1; a coupling capacitor 2; an RF tuning circuit 3; a transistor 4; an RF coupling circuit 5; a coupling capacitor 6; a transistor 7; a collector tuning circuit 8; a band pass filter 9; a coupling terminal 10; base bias supply resistors 11 and 12; a buffer circuit 13; a control signal input terminal 14; and a power source terminal 15. The power amplifying section B comprises: a coupling capacitor 16; an FET transistor 17; an RF coupling circuit 18; a coupling capacitor 19; an FET transistor 20; an RF coupling circuit 21; a coupling capacitor 22; an RF output terminal 23; gate voltage supply resistors 24 and 25; a gate voltage terminal 26; and power source terminals 27 and 28.

An output of the power amplifying section B is transmitted from an antenna 31 through a directional coupler 29 and a common transmitter/receiver 30 and is sent from the directional coupler 29 to a detecting circuit 32. A subtracting circuit 33 subtracts an output of the detecting circuit 32 from an externally-supplied amplitude setting signal provided at a terminal 34 and forms an exciting section control signal. The exciting section control signal is supplied to the control signal input terminal 14. On the other hand, a control signal forming circuit 35 forms a power amplifying section control signal on the basis of the amplitude setting signal and supplies it to the gate voltage terminal 26.

The operation of each section of the amplifier shown in FIG. 1 will now be described.

(1) Operation of the Exciting Section A

A radio input signal is supplied to the RF input terminal 1. A frequency of the radio input signal is set by a frequency synthesizer. An output signal of the frequency synthesizer is supplied to the RF input terminal 1 through a buffer amplifier. When the radio input signal is supplied to the RF input terminal 1, it is sent to the wide band tuning circuit 3 through the coupling capacitor 2 and is amplified by the transistor 4. The amplified signal is supplied to the transistor 7, by which it is further amplified. The amplified signal of the transistor 7 is input to the band pass filter 9 and is sent through the coupling terminal 10 to the power amplifying section B. When the radio input signal is amplified by the transistors 4 and 7, the exciting section control signal from the APC circuit is supplied through the buffer circuit 13 to bases of the transistors 4 and 7. Bias currents of the transistors 4 and 7 are adjusted by the exciting section control signal. That is, the output voltage of the exciting section A is variably controlled by the exciting section control signal.

(2) Operation of the Power Amplifying Section B

The power amplifying section B receives the output signal of the exciting section A through the coupling capacitor 16. The received signal is power amplified by the FET transistor 17 and is, further, power amplified by the FET transistor 20. The power amplified signal is output from the RF output terminal 23. When the input signal is power amplified by each of the transistors 17 and 20, a gate voltage of each of the transistors 17 and 20 is adjusted by a power amplifying section control signal which is supplied to the gate voltage terminal 26, thereby controlling an operating point of each of the transistors 17 and 20.

That is, in the power amplifying section B, the excitation signal from the coupling terminal 10 is received and the electric power is transmitted from the output terminal 23 to the antenna 31 through the directional coupler 29 and the common transmitter/ receiver 30. To make the transmission output stable, a detection component of a travelling wave component of the directional coupler is compared with the amplitude setting signal, which is given from the outside, so as to obtain an exciting section control signal, and the transmission output is set to a constant power by the exciting section control signal which is supplied to the control signal input terminal 14. In the embodiment, the operating points of the transistors 17 and 20 are adjusted in accordance with the magnitude of the power amplifying section control signal formed by the control signal forming circuit 35. That is, a value of the power amplifying section control signal $V_{GG}$ which is supplied to the gate voltage terminal 26 is set to an arbitrary value. The transistor 17 is made operative by the AB class and the transistor 20 is made operative by the C class. Or, the transistors 17 and 20 are made operative by the AB class. Or, the transistor 17 is made operative by the B class and the transistor 20 is made operative by the D class. Thus, a current as shown in FIG. 2 flows in a drain of each of the transistors 17 and 20.

Figure 2:
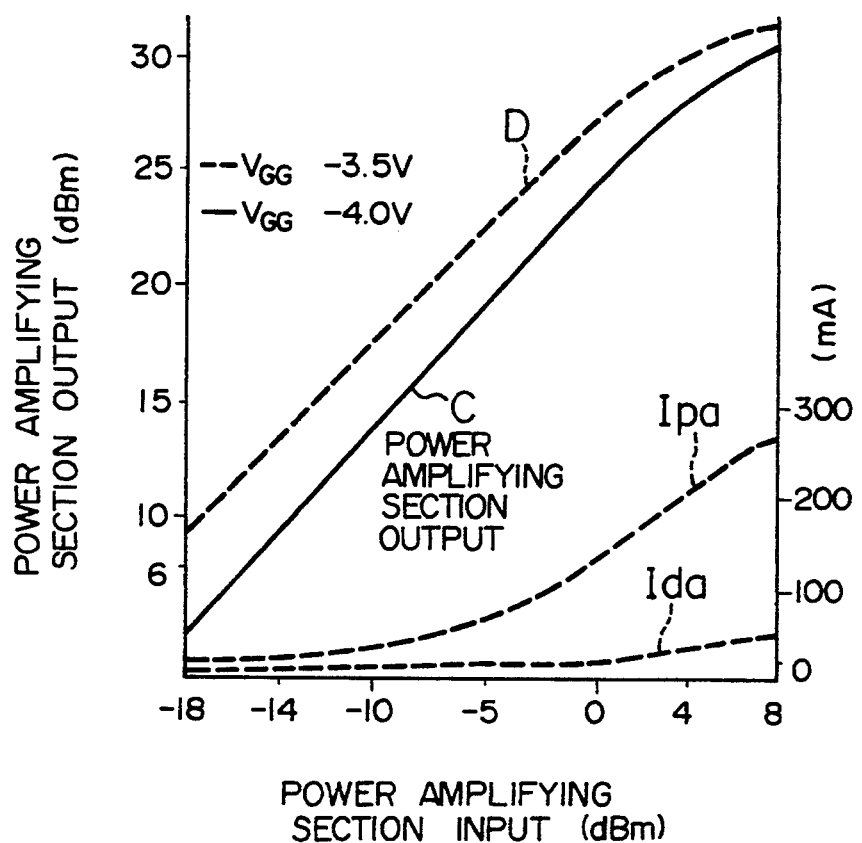
FIG. 2 is a graph showing the input/output characteristics of a power amplifying section in the embodiment shown in FIG. 1.
Figure 3:
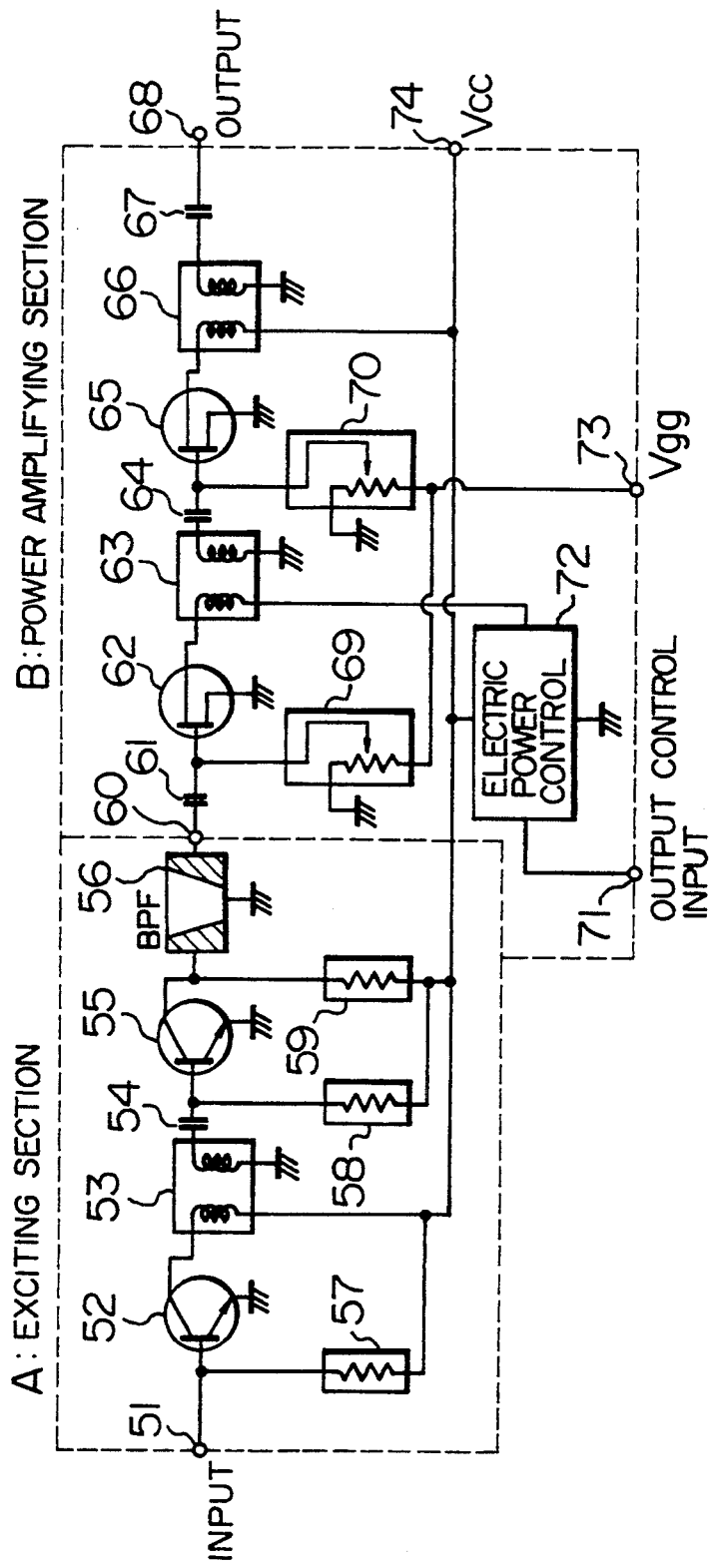
FIG. 3 is a block diagram showing a construction of a conventional transmission power amplifier.

The drain currents of the transistors 17 and 20 change as shown by $I_{da}$ and $I_{pa}$ in FIG. 2 by an excitation input and an output electric power changes along an output curve C for the excitation input. An output curve D is an output curve when a power amplifying section control signal voltage $V_{GG}$ is raised.

For example, by setting the voltage $V_{GG}$ of the power amplifying section control signal to −4.0 V at the minimum output stage and by increasing $V_{GG}$ from −4.0 V to −3.5 V at the stages other than the minimum output stage, the operating point of the transistor 20 is shifted from the C class to the AB class, thereby also enabling the output electric power of the power amplifying section B to be increased. As mentioned above, the control signal forming circuit 35 forms the power amplifying section control signal in accordance with the amplitude setting signal and adjusts the maximum output of the power amplifying section B.

According to the embodiment, since the bias current of the transistor has been adjusted in accordance with the magnitude of the radio input signal, the number of batteries can be reduced by eliminating at least (n) (including one) batteries. By reducing the number of batteries, the apparatus can be miniaturized and reduced in size. The bias current when the amplitude setting signal is small can be decreased. When the amplitude setting signal is large, the excitation electric power can be increased, so that the output to electric power consumption characteristics for each output can be highly efficiently maintained. Since the bias currents of two amplifying elements are adjusted in each section, waveform distortion when the bias current changes is reduced. Waveform distortion which remains even by using such a reducing process is decreased by the band pass filter 9 or the tuning circuits (3, 5, 8, 18, 21) having band pass characteristics.

As will be obviously understood from the above embodiment, the invention has the following effects.

Since the bias current of each of the amplifying elements in the exciting section and the power amplifying section has been adjusted in accordance with the magnitude of the amplitude setting signal, when the amplitude setting signal is small, the bias current is reduced. When the amplitude setting signal is large, the excitation electric power can be increased. Thus the power source can be effectively used. The output to electric power consumption characteristics can be highly efficiently maintained.

We claim

1. A transmission power amplifier comprising: an exciting section, comprising a plurality of amplifying elements connected in series, for voltage amplifying an input signal;
    a power amplifying section, comprising a plurality of amplifying elements connected in series, for power amplifying an output signal of the exciting section;
    a directional coupler coupled to an output of said power amplifying section;
    a detecting circuit for detecting a signal obtained from said directional coupler;
    a subtracting circuit for obtaining an exciting section control signal by subtracting an output of said detecting circuit from an externally-supplied amplitude setting signal;
    exciting section output control means for adjusting a bias current of at least one of said amplifying elements of said exciting section in accordance with a magnitude of the exciting section control signal, thereby controlling an output voltage of said exciting section;
    a control signal forming circuit for obtaining a power amplifying section control signal on the basis of said amplitude setting signal; and
    power amplifying section output control means for adjusting a bias current of at least one of said amplifying elements of said power amplifying section in accordance with a magnitude of said power amplifying section control signal, thereby controlling an output electric power of said power amplifying section.

2. An amplifier according to claim 1, wherein at least one of said amplifying elements of said exciting section is a bipolar transistor and at least one of the amplifying elements of said power amplifying section is an FET.

3. An amplifier according to claim 1, wherein a number of said amplifying elements of said exciting sections whose bias currents are adjusted is plural.

4. An amplifier according to claim 1, wherein in each of (i) said exciting section and (ii) said power amplifying section, a number of said amplifying elements whose bias currents are adjusted is plural.

5. An amplifier according to claim 1, further comprising filter means, having band pass characteristics, operatively associated with an output of each of said amplifying elements of said exciting section.

6. An amplifier according to claim 1, further comprising filter means, having band pass characteristics, operatively associated with an output of each of said amplifying elements.

7. An amplifier according to claim 1, wherein said amplifying elements of said exciting section comprise an AB class transistor and a C class transistor.

8. An amplifier according to claim 1, wherein said amplifying elements of said exciting section comprise two AB class transistors.

9. An amplifier according to claim 1, wherein said amplifying elements of said exciting section comprise an B class transistor and a D class transistor.

* * * * *